United States Patent [19]

Rose

[11] Patent Number: 5,021,751
[45] Date of Patent: Jun. 4, 1991

[54] QUADRATURE OSCILLATOR NETWORK

[76] Inventor: Mitchell Rose, 3718 Silsby Rd., University Hts., Ohio 44118

[21] Appl. No.: 485,936

[22] Filed: Feb. 27, 1990

[51] Int. Cl.$^5$ .................. H03B 5/24; H03B 27/00
[52] U.S. Cl. .................................. 331/135; 331/45; 331/108 B
[58] Field of Search ................. 331/45, 108 B, 135

[56] References Cited

U.S. PATENT DOCUMENTS

| 3,889,206 | 6/1975 | Mayer | 331/45 |
| 3,894,291 | 7/1975 | Mayer | 331/135 X |
| 4,124,827 | 11/1978 | Hileman | 331/108 B X |

OTHER PUBLICATIONS

Berlin, H., "Design of Op-Amp Circuits with Experiments", Howard W. Sams Co. (1st Ed. 1977).

Jung, W., "IC Op-Amp Cookbook", (Publisher and Publication Date Unknown).

Primary Examiner—David Mis
Attorney, Agent, or Firm—Calfee, Halter & Griswold

[57] ABSTRACT

A quadrature oscillator network for simultaneously producing a sine wave and a cosine wave. The oscillator includes an integrating circuit and a time delay circuit, each of which is preferably constructed, in part, with an operational amplifier. In one example, a first output is developed from the integrating circuit and transmitted to the time delay circuit. The time delay circuit receives the first output from the integrating circuit and generates a second output. The integrating circuit and the time delay circuit are interconnected with a feedback branch which is employed to transmit the second output of the time delay circuit to an input of the integrating circuit. In the preferred form of operation, the first output is sinusoidal in form and the second output is cosinusoidal in form.

12 Claims, 1 Drawing Sheet

QUADRATURE OSCILLATOR NETWORK

BACKGROUND

This device relates to electrical circuits that generate analog output waveforms and more particularly to an operational amplifier ("op-amp") based sine and cosine wave oscillator.

In the field of electronic systems it is often necessary to provide two sine waves in quadrature, or with 90° phase difference between them. This function is always satisfied by oscillators which simultaneously produce sine and cosine waveforms. These outputs are then used as inputs to other types of electronic circuits, such as timing circuits.

In a circuit such as that shown by Berlin, two op-amps are electronically interconnected to function as integrators. (FIG. 6-4, Berlin p. 136). The outputs of op-amps A1 and A2, respectively, are sine and cosine waveforms of uniform frequency. The frequency is dependent upon the value of resistance chosen for R and the value of capacitance chosen for C. The greater the product of R×C, the lower the frequency output of the device. The value of resistance chosen for R1 is less than that of R so that the circuit begins oscillating immediately upon the application of power.

In a circuit such as that shown by Jung, again two op-amps are electronically interconnected to function as integrators. (FIG. 10-4, Jung p. 365). The integrators are in cascade using positive feedback. R2 is slightly lower in resistance value than the other resistors in the circuit to ensure starting. The outputs of op-amps A1 and A2 deliver sine and cosine waves, respectively, upon the application of power.

SUMMARY OF THE INVENTION

The present invention relates to a quadrature oscillator network capable of simultaneously producing a sine wave and a cosine wave. The network includes a first circuit means for integrating a waveform as well as producing a first output. The first circuit means includes at least one input for receiving the waveform. Moreover, the network includes a second circuit means for generating a time delay.

The second circuit means is adapted to receive the first output from the first circuit means and produce a second output. The second output is fed back to the first input of the first circuit means by way of feedback means wherein the first output has a phase which differs from the second output by about 90°. In the preferred embodiment, each of the first circuit means and second circuit means includes an op-amp, and the first circuit means has a feedback loop including a capacitor.

The network can be employed with most commonly available op-amps and the network's characteristic parameters, such as amplitude and frequency, are advantageously predictable. For example, assuming that values for voltage supply, resistance (R) and capacitance (C) are constant, the magnitude for the amplitude of the first output and the frequency of both of the first and second outputs can be predicted by the following equations:

$$Log(Ampl) = MLog(RC) + N$$

where M and N respectively represent values for slope and Y-intercept as determined from an X-Y plot of Log(Ampl) v. Log(RC).

$$Freq = SLog(RC) + T$$

where S and T respectively represent values for slope and Y-intercept as determined from an X-Y plot of Freq v. Log(RC).

Numerous advantages of the present invention will be appreciated by those skilled in the art.

One advantage of the invention is that it presents a particularly economical way to simultaneously provide sine and cosine waveforms which can advantageously be used with other electronic circuits, such as timing circuits. More specifically, as compared with commonly employed op-amp sine wave oscillators, componentry requirements are considerably reduced, so that cost savings can be realized and manufacturing efficiencies maximized.

A further advantage of the invention is that the network can be constructed from a wide variety of componentry. In particular, the network can be used with many commonly employed op-amps. Moreover, a relatively wide range of amplitudes and frequencies can be achieved for the network by selectively employing op-amps having varying characteristic values and parameters.

A still further advantage of the invention is that the network is highly predictable for a variety of commonly employed op-amps. That is, for given supply voltage levels, relatively simple equations can be developed for the network to succinctly predict values for amplitude and frequency. Generally, when two op-amps of similar construction are used, the equation for predicting amplitude can be considerably simplified such that amplitude can be predicted upon determining just one of the characteristic values of op-amps used in the network.

These and other features, advantages and objects of the present invention will be further understood and appreciated by those skilled in the art by reference to the following written specification, claims and appended drawings.

DETAILED DESCRIPTION OF THE PREFERRED EMBODIMENT

It is to be understood that the invention, as described below, may assume various alternative orientations and step sequences except where expressly specified to the contrary. It is also to be understood that the specific devices and processes illustrated in the attached drawings, and described in the following specification, are simply exemplary embodiments of the inventive concepts defined in the appended claims. Hence, specific dimensions, and other physical characteristics relating to the embodiments disclosed herein are not to be considered as limiting, unless the claims by their language expressly state otherwise.

Figure 1:
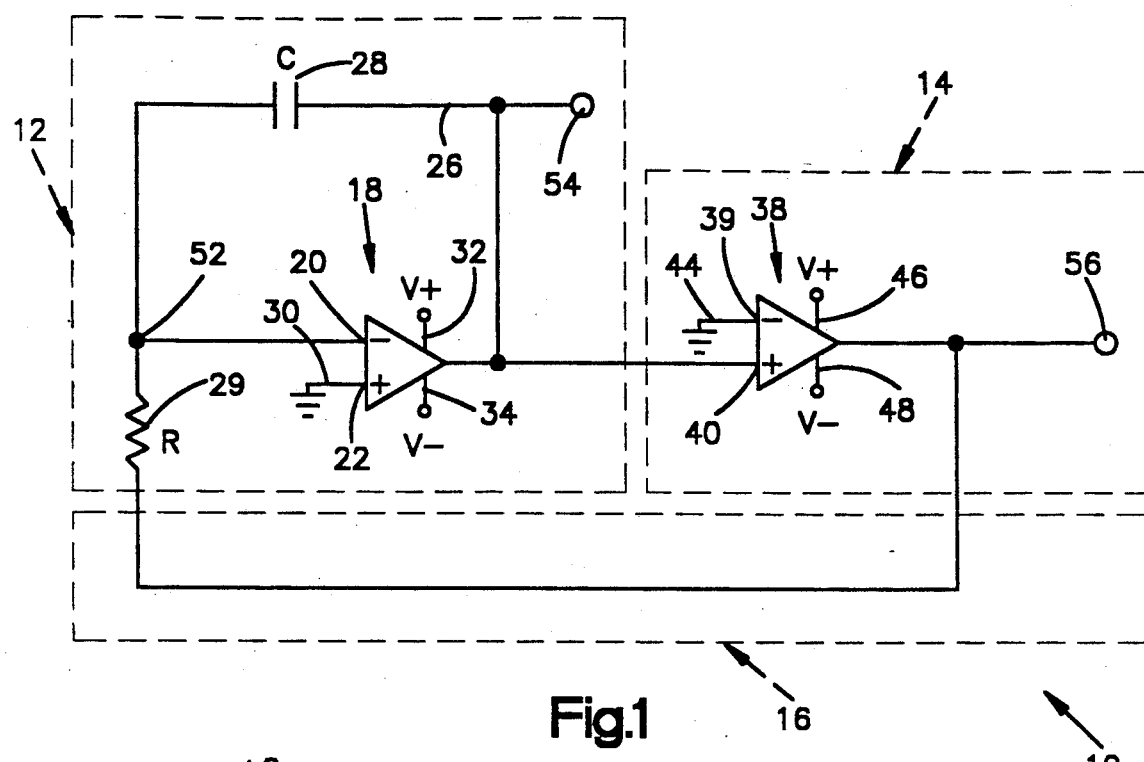
FIG. 1 is a diagram depicting the quadrature oscillator network embodying the present invention.

Referring to FIG. 1, a network according to the invention is designated by the reference numeral 10.

The network 10 includes an integrating circuit 12, a time delay circuit 14, and feedback branch 16.

In the preferred embodiment, integrating circuit 12 includes an op-amp 18 having an inverting input 20 and a non-inverting input 22. The op-amp 18 generates a first output. A resistor 29 is coupled to the inverting input 20 and the non-inverting input 22 is shorted to ground by way of a line 30. Op-amp 18 is provided with voltage inputs 32 and 34 at which positive and negative voltages are established, respectively.

Time delay circuit 14 includes an op-amp 38 having an inverting input 39 and a non-inverting input 40. The first output is imparted to the non-inverting input 40 of op-amp 38, while the inverting input 39 of op-amp 38 is shorted to ground by way of line 44. Op-amp 38 is provided with voltage inputs 46 and 48 at which positive and negative voltages are established, respectively.

As will be appreciated by those skilled in the art, time delay circuit 14 assumes the form of a basic comparator, which by definition is simpler in construction than an op-amp based integrator, such as integrating circuit 12. It is highly advantageous that the op-amp based comparator of time delay circuit 14 is capable of generating a time delay. It is believed that the delay generated by the comparator is caused by the slew rate inherent in the op-amp 38. The slew rate is the maximum rate at which the op-amp output voltage can change in response to input voltage changes. The slew rate of op-amp 38 is determined by internal op-amp currents available to charge internal op-amp capacitances. Thus, the internal characteristics of op-amp 38 determine the rate at which the output voltage signal can follow the input voltage signal. If the slew rate is such that the output cannot simultaneously follow the input, the output lags the input due to the delay introduced by the op-amp based comparator. This time delay, when used in conjunction with the first output, allows for the achievement of one aspect of the subject invention, i.e. to provide a structurally simpler quadrature oscillator than heretofore encountered, since the need to use two integrators is eliminated.

In the preferred embodiment, the output of op-amp 38, i.e. a second output, is communicated through R29 to the inverting input 20 of op-amp 18 by way of feedback branch 16. As illustrated in FIG. 1, the signals of feedback branches 16 and 26 are combined at node 52

In the most preferred embodiment of the invention, op-amp 18 and op-amp 38 are similar in construction. Use of similar op-amps allows for greater predictability with respect to operation. It should be understood, however, that an operable embodiment of network 10 could be achieved with an op-amp 18 having one set of specifications and an op-amp 38 having a dissimilar set of specifications.

In operation, when supply voltages are established at voltage inputs 32, 34 and 46, 48, network 10 functions as a sine-cosine (quadrature) oscillator. In the present example, sine and cosine waves are simultaneously generated, during operation, at output nodes 54 and 56, respectively.

Applicant has found that network 10 is capable of operating as a quadrature oscillator when one of at least five different op-amp types is employed. The following Table 1 indicates those five op-amp types, along with recommended supply voltages and respective slew rates, as actually measured during operation of network 10.

TABLE 1

|  | A | B | C | D | E |
|---|---|---|---|---|---|
| Op Amp: | MC34084 | TL074 | TLC27M4 | LM324 | TLC27L4 |
| Supply Voltage (V): | +−16 | +−16 | +−7.5 | +−15 | +−7.5 |
| Slew rate (V/µs): | 31 | 15 | .8 | .3 | .06 |

The five op-amp types employed are designated by the letters A, B, C, D, and E, respectively. It should be understood that other op-amp types could be used to construct a network 10 without impairing the ability of the same to provide adequate quadrature oscillation. More specifically, the output frequency and amplitude for a given op-amp is in part defined by the slew rate of the given op-amp. Since Applicant tested network 10 with op-amps having a wide range of slew rates (Table 1), it is possible to generalize the results achieved from testing networks 10 using only these five op-amp types.

Referring to the following Table 2, values of sine-cosine wave amplitudes corresponding to each network 10 constructed using two op-amps from the five exemplary op-amp groups are indicated.

TABLE 2

| Log (RC) | Amp 1 | | | | |
|---|---|---|---|---|---|
|  | A | B | C | D | E |
| 0 | 10.4 | 14.5 | — | — | — |
| 1 | 1.6 | 2.6 | 4.2 | — | — |
| 2 | .4 | .6 | .8 | 5.8 | 2.7 |
| 3 | — | .2 | .19 | .8 | .92 |
| 4 | — | — | .054 | .12 | .17 |
| 5 | — | — | — | .021 | .042 |

In Table 2 the amplitudes generated from the networks 10 at node 54 (FIG. 1), which were measured peak-to-peak in volts, are tabulated against the values of the log of the product of resistance for resistor 29 (R), which is expressed in ohms, and the capacitance of capacitor 28 (C), which is expressed in µF. The dashes of Table 2 correspond to the values of RC for which sine and cosine waves could not be produced. Additionally, it should be recognized that the amplitude of the output at node 56 is not regulated as is the output at node 54. That is, in one example, the magnitude of the second output extends within 1.0 volt of the high and low power supply voltages, regardless of the R and C values. Indeed, it may be desirable to regulate the output at node 56 using a limiting device, such as the zener diode limiting device disclosed in Berlin in FIG. 6-5.

Figure 2:
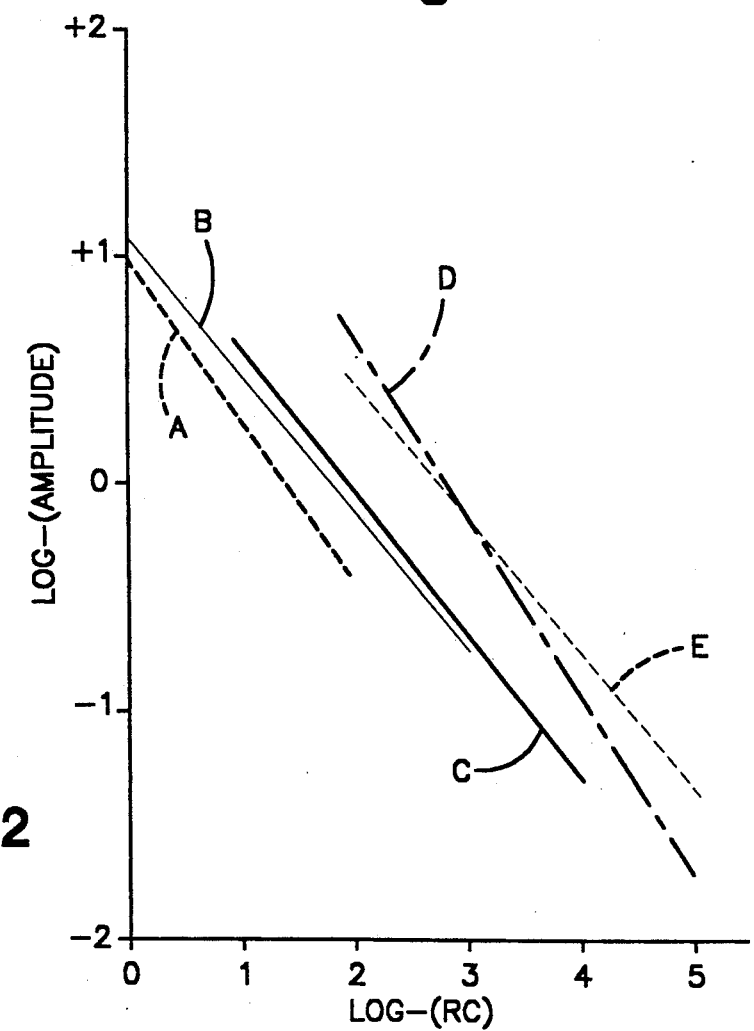
FIG. 2 is a plot of data achieved from various networks constructed in accordance with the present invention using various common op-amps.

Upon plotting the values of log (RC) and log (Ampl), as in FIG. 2, applicant determined that the network 10 can be characterized the following equation:

$$Log(Ampl) = M \, Log(RC) + N \tag{1}$$

or $$Ampl = [(RC)^M][10^N] \tag{2}$$

where M and N respectively represent the slope and the Y-intercept on the X-Y plot of FIG. 2

Examination of equation 1 or equation 2 reveals that the amplitude of the output produced at node 54 can be predicted through knowledge of the values for R and C as well as the particular op-amp characteristics M and N values.

Values for slope and Y-intercept for each of the plots A-E in FIG. 2 are listed below in Table 3. It should be appreciated that with the values of Table 3 and the slew rate of a given op-amp, the values of M and N for any given op-amp can be estimated by using basic interpolative techniques.

TABLE 3

| | Op-Amp | | | | |
|---|---|---|---|---|---|
| | A | B | C | D | E |
| M = slope | −.71 | −.62 | −.64 | −.81 | −.62 |
| N = Intercept | .98 | 1.09 | 1.22 | 2.36 | 1.72 |
| Corr coef | −.996 | −.995 | −.9989 | −.9996 | −.9968 |

It can be noted that the slopes of the plotted curves in FIG. 2 range from about (−0.6)-(−0.8). Within acceptable experimental error, the parameter is essentially constant for the op-amps employed. Therefore, in view of the above examples, operation of network 10 can be characterized by the following equation 3 or equation 4.

$$Log(Ampl) = -0.7 \; Log(RC) + N \quad (3)$$

or $$Ampl = [(RC)^{-0.7}][(10)^N] \quad (4)$$

Use of equation 3 or equation 4 allows for prediction of network 10 with the knowledge of only one characteristic parameter for each op-amp.

Similar analysis to that performed for amplitude can be achieved by plotting values of frequencies for the above-mentioned five op-amp types against the log of the product of the corresponding values of R and C on an X-Y plot. While the plot for frequency v. log (RC) is not shown herein, it can be accepted that for each of the networks 10 constructed using the five op-amp types, a straight line was achieved which fits the following equation 5.

$$Freq = S \; Log(RC) + T \quad (5)$$

where S and T respectively represent the slope and the Y-intercept on an X-Y plot in which Freq corresponds to the Y-axis and Log(RC) corresponds to the X-axis Unlike the case of amplitude, equation (5) can be generalized to both the output at node 54 and the output at node 56.

The following Table 4 includes values of slopes and Y-intercepts that would be achieved from plots of Freq vs Log (RC) for the op-amp networks tested.

TABLE 4

| | OpAmp = | | | | |
|---|---|---|---|---|---|
| | A | B | C | D | E |
| S = slope | 195 | 80 | 10 | 1.6 | .60 |
| T = Intercept | 508 | 258 | 43 | 9 | 3.6 |
| Corr coef | −.987 | −.983 | −.991 | −.985 | −.982 |

In accordance with equation 5, the frequency of network 10 can be predicted for any given values of R and C once the characteristic values of S and T have been determined.

Applicant has found that amplitude and frequency, as determined from both equations 1-2 and 5, vary as a function of supply voltage. In particular, amplitude, on the one hand, varies proportionately with supply voltage, while frequency only varies slightly in response to supply voltage. Nonetheless, the values of either Table 3 or Table 4 can only be consistently reproduced, with acceptable experimental error, if supply voltage is maintained at a constant level.

In the foregoing description, it will be readily appreciated by those skilled in the art that modifications may be made to the invention without departing from the concepts disclosed herein. Such modifications are to be considered as included in the following claims unless these claims, by their language, expressly state otherwise.

The embodiments of the invention in which an exclusive property or privilege is claimed are defined as follows:

1. A network adapted to function as a quadrature oscillator comprising:
   first circuit means for integrating a waveform and producing a first output which leads said waveform by about 90°, said first circuit means including at least a first input for receiving said waveform;
   second circuit means comprising an op-amp having a first input coupled directly to said first circuit means to receive said first output, and a second input coupled directly to ground, said second circuit means producing a second output lagging said first output by about 90°; and
   first feedback means for feeding back said second output to said first input of said first circuit means.

2. The network of claim 1, wherein:
   said first circuit means includes an op-amp having said first input and said first circuit means includes second feedback means for feeding back said first output through a capacitor and into said first input of said first circuit op-amp, wherein both of said first and second outputs are combined and communicated to said first input of said op-amp.

3. The network of claim 2, wherein:
   said first circuit op-amp has an inverting and a non-inverting input, and said first input is an inverting input.

4. The network of claim 3, wherein:
   said non-inverting input of said first circuit op-amp is shorted to ground.

5. The network of claim 1, wherein:
   said second circuit op-amp has an inverting input and a non-inverting input and wherein said inverting input is shorted to ground.

6. The network of claim 1, wherein:
   said first circuit means includes a capacitor having a predetermined capacitance (C) and a resistor having a predetermined resistance (R), and wherein said network is characterized by the following equation:

$$Amplitude = [(RC)^M][10^N]$$

wherein said Amplitude refers to the amplitude of said first output, and M and N are values varying as a function of the electrical characteristics of one of said first circuit means and said second circuit means.

7. The network of claim 1, wherein:
   said first circuit means includes a capacitor having a predetermined capacitance (C) and a resistor having a predetermined resistance (R), and wherein said network is characterized by the following equation:

$$Frequency = S[Log(RC)] + T$$

wherein said Frequency refers to the frequency of one of said first output and said second output, and S and T are values varying as a function of the electrical characteristics of one of said first circuit means and said second circuit means.

8. A network adapted to function as a quadrature oscillator comprising:
   first circuit means for integrating a waveform and producing a first output which leads said waveform by about 90°, said first circuit means having at least a first input, and said first circuit means including a capacitor having a predetermined capacitance (C) and a resistor having a predetermined resistance (R);
   second circuit means comprising an op-amp having a first input coupled directly to said first circuit means to receive said first output, and a second input coupled directly to ground, said second circuit means producing a second output lagging said first output by about 90°;
   first feedback means for feeding back said second output to said first input of said first circuit means; and
   wherein said first output is characterized by the following equation:

$$Amplitude = [(RC)^M][10^N]$$

wherein said Amplitude refers to the amplitude of said first output and M and N are values varying as a function of the electrical characteristics of one of said first circuit means and said second circuit means.

9. The network of claim 8, wherein:
   the value of M is approximately within the range of (−0.6)−(−0.8).

10. A network adapted to function as a quadrature oscillator comprising:
    first circuit means for integrating a waveform and producing a first output which leads said waveform by about 90°, said first circuit means having at least a first input, and said first circuit means having a capacitor having a predetermined capacitance (c) and a resistor having a predetermined resistance (R);
    second circuit means comprising an op-amp having a first input coupled directly to said first circuit means to receive said first output, and a second input coupled directly to ground, said second circuit means producing a second output lagging said first output by about 90°;
    first feedback means for feeding back said second output to said first input of said first circuit means; and
    wherein said network is characterized by the following equation:

$$Frequency - S[Log(RC)] + T$$

wherein said Frequency refers to the frequency of one of said first output and said second output, and S and T are values varying as a function of the electrical characteristics of one of said first circuit means and said second circuit means.

11. A method for generating quadrature oscillation comprising the steps of:
    providing first circuit means having at least a first input;
    integrating a waveform using said first circuit means to produce a first output leading said waveform by about 90°;
    providing second circuit means comprising an op-amp based comparator having a first input coupled directly to said first circuit means and a second input coupled directly to ground;
    transmitting said first output to said second circuit means;
    delaying said first output using said second circuit means to produce a second output lagging said first output by about 90°; and
    feeding back said second output to an input of said first circuit means.

12. The method of claim 11, further comprising the steps of:
    providing said first circuit means with a capacitor;
    feeding said first output across said capacitor and into said first input of said first circuit op-amp;
    combining said first output and said second output; and
    transmitting said combined output to said first input of said first circuit means.

* * * * *